(12) United States Patent
Seok et al.

(10) Patent No.: US 11,142,233 B2
(45) Date of Patent: Oct. 12, 2021

(54) STEERING WHEEL AND METHOD FOR CONTROLLING THE SAME

(71) Applicants: HYUNDAI MOTOR COMPANY, Seoul (KR); KIA MOTORS CORPORATION, Seoul (KR)

(72) Inventors: Donghee Seok, Suwon-si (KR); Gideok Kwon, Seoul (KR); Jong Bok Lee, Suwon-si (KR); HeeJin Ro, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 472 days.

(21) Appl. No.: 16/199,694

(22) Filed: Nov. 26, 2018

(65) Prior Publication Data

US 2019/0210630 A1    Jul. 11, 2019

(30) Foreign Application Priority Data

Jan. 5, 2018    (KR) ........................ 10-2018-0001959

(51) Int. Cl.
| | |
|---|---|
| *B62D 1/04* | (2006.01) |
| *B62D 1/06* | (2006.01) |
| *G06F 3/044* | (2006.01) |
| *B60K 35/00* | (2006.01) |
| *H03K 17/96* | (2006.01) |
| *G06F 1/3234* | (2019.01) |
| *G06F 3/041* | (2006.01) |

(52) U.S. Cl.
CPC .............. *B62D 1/046* (2013.01); *B60K 35/00* (2013.01); *B62D 1/06* (2013.01); *G06F 1/3262* (2013.01); *G06F 3/044* (2013.01); *G06F 3/0443* (2019.05); *G06F 3/0448* (2019.05); *G06F 3/041661* (2019.05); *H03K 17/9622* (2013.01); *B60K 2370/1446* (2019.05); *B60K 2370/782* (2019.05); *G06F 3/04186* (2019.05); *G06F 2203/04107* (2013.01); *H03K 2017/9602* (2013.01); *H03K 2217/960775* (2013.01)

(58) Field of Classification Search
CPC .............. B60K 35/00; B60K 2370/122; B60K 2370/1434; B60K 2370/1446; B60K 2370/782; B60K 37/06; B62D 1/046; B62D 1/06; G06F 3/044; G06F 1/3262; G06F 2203/04107; G06F 3/041661; G06F 3/04186; G06F 3/0443; G06F 3/0448; H03K 17/9622; H03K 2017/9602; H03K 2217/960775; B60W 50/16
See application file for complete search history.

(56) References Cited

U.S. PATENT DOCUMENTS

| | | | | |
|---|---|---|---|---|
| 9,159,221 | B1 * | 10/2015 | Stantchev | ................ B62D 1/06 |
| 10,077,064 | B2 * | 9/2018 | Iguchi | ...................... B62D 1/06 |
| 10,635,225 | B2 * | 4/2020 | Seok | ..................... G06F 3/0488 |

(Continued)

*Primary Examiner* — David D Davis
(74) *Attorney, Agent, or Firm* — Morgan, Lewis & Bockius LLP

(57) ABSTRACT

Disclosed is a steering wheel. The steering wheel includes a wheel frame; a base coupled to cover the wheel frame; a sensor electrode arranged on the base and configured to receive a driver's touch input; and a controller configured to set up a touch area for manipulation to control components of a vehicle based on a touch area of the sensor electrode having received the touch input.

19 Claims, 11 Drawing Sheets

(56) References Cited

U.S. PATENT DOCUMENTS

| | | | |
|---|---|---|---|
| 2006/0033628 A1* | 2/2006 | Duval | A61B 5/082 |
| | | | 340/576 |
| 2008/0143504 A1* | 6/2008 | Martin Alvarez | B60K 28/066 |
| | | | 340/439 |
| 2011/0057785 A1* | 3/2011 | Golomb | B60Q 1/343 |
| | | | 340/475 |
| 2012/0271500 A1* | 10/2012 | Tsimhoni | B62D 1/046 |
| | | | 701/23 |
| 2014/0156107 A1* | 6/2014 | Karasawa | G01C 21/3664 |
| | | | 701/1 |
| 2014/0292692 A1* | 10/2014 | Okuyama | B62D 1/046 |
| | | | 345/173 |
| 2015/0217687 A1* | 8/2015 | Colvin, Sr. | B60W 50/14 |
| | | | 180/272 |
| 2016/0334876 A1* | 11/2016 | Park | G06F 3/0487 |
| 2017/0305453 A1* | 10/2017 | Nishio | B62D 1/046 |
| 2017/0334392 A1* | 11/2017 | Frey | B60K 35/00 |
| 2019/0210629 A1* | 7/2019 | Kwon | B60R 16/027 |
| 2021/0129705 A1* | 5/2021 | Head | H01M 10/4257 |

* cited by examiner

STEERING WHEEL AND METHOD FOR CONTROLLING THE SAME

CROSS-REFERENCE TO RELATED APPLICATION

This application is based on and claims priority under 35 U.S.C. § 119 to Korean Patent Application No. 10-2018-0001959 filed on Jan. 5, 2018, in the Korean Intellectual Property Office, the disclosure of which is incorporated herein by reference in its entirety.

TECHNICAL FIELD

The present disclosure relates to a steering wheel and method for controlling the same.

BACKGROUND

Vehicles basically run on the road but also provide various user convenient functions, such as audio play, video play, navigation, air conditioning control, seat control, lighting control, etc.

With the development of smart phones and the additional functions of the vehicle, the driver is likely to be distracted by the use of the smart phone and the additional functions of the vehicle while driving. Especially, the drivers increasingly use the smart phone without holding the steering wheel, causing increasing accidents.

If the driver does not hold the steering wheel, steering control of the vehicle may not be properly performed, thereby leading to a serious traffic accident.

To solve this, a touch input part is recently arranged on the steering wheel to reduce distraction of the driver behind the wheel and to facilitate the driver's convenience, so the driver is able to control components of the vehicle while holding the steering wheel.

SUMMARY

Embodiments of the present disclosure provide a steering wheel and method for controlling the same, by which the rim of the steering wheel may be used as a touch input part.

In accordance with an aspect of the present disclosure, a steering wheel is provided. The steering wheel includes a wheel frame; a base coupled to cover the wheel frame; a sensor electrode arranged on the base and configured to receive a driver's touch input; and a controller configured to set up a touch area for manipulation to control components of a vehicle based on a touch area of the sensor electrode having received the touch input.

The steering wheel may further include a sensor integrated circuit (IC) electrically connected to the sensor electrode and configured to detect an amount of change in capacitance of the sensor electrode.

The controller may determine a palm touch input of the driver and set up a touch area for manipulation around a touch area having received the palm touch input.

The controller may determine a palm touch input of the driver and set an area separated from a touch area having received the palm touch input by a preset offset to the touch area for manipulation.

The controller may set two areas separated from the touch area having received the palm touch input by the preset offset in opposite directions to the touch area for manipulation.

If a touch input is received in the touch area for manipulation, the controller may change an offset based on a point at which the touch input is received in the touch area for manipulation.

The controller may change the offset based on a distance between the point at which the touch input is received and a point in the palm touch area.

The controller may set up a plurality of touch areas for manipulation, activate the plurality of touch areas for manipulation, and if at least one of the plurality of touch areas for manipulation receives a touch input, deactivate the rest of the plurality of touch areas for manipulation, in which no touch input is received.

The controller may activate a deactivated touch area for manipulation if the at least one of the plurality of touch areas receives no touch input.

The controller may deactivate an activated touch area for manipulation if no touch input is received in the activated touch area for manipulation.

The base may include a metal complex, and the sensor electrode is a conductive layer filling a groove in the base.

The wheel frame may include a rim and the base may be formed to cover the rim.

The base may be provided in the plural, and the plurality of bases may be provided to cover different areas on the rim.

The wheel frame may include a spoke, and the steering wheel may further include a printed circuit board arranged in the spoke and having the sensor IC thereon The steering wheel may further include a connector connecting the sensor electrode and the printed circuit board.

The connector may include a body part coupled with the base and a contact part in contact with the printed circuit board.

The body part may include a flexible printed circuit board.

The sensor electrode may include a first sensor electrode and a second sensor electrode spaced apart from the first sensor electrode.

The first sensor electrode and the second sensor electrode may be arranged on the same layer.

In accordance with another aspect of the present disclosure, a method for controlling a steering wheel having a wheel frame and a base coupled to cover the wheel frame is provided. The method includes receiving a touch input of a driver by a sensor electrode arranged on the base and configured to receive a touch input of the driver; and setting up a touch area for manipulation to control components of a vehicle based on a touch area of the sensor electrode having received the touch input.

According to embodiments of the present disclosure, a steering wheel may be provided with the rim of the steering wheel used as a touch input part.

Furthermore, the touch input part on the steering wheel provided in the vehicle may have increased usability and convenience and may allow inputting of various operation commands.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

Figure 1:
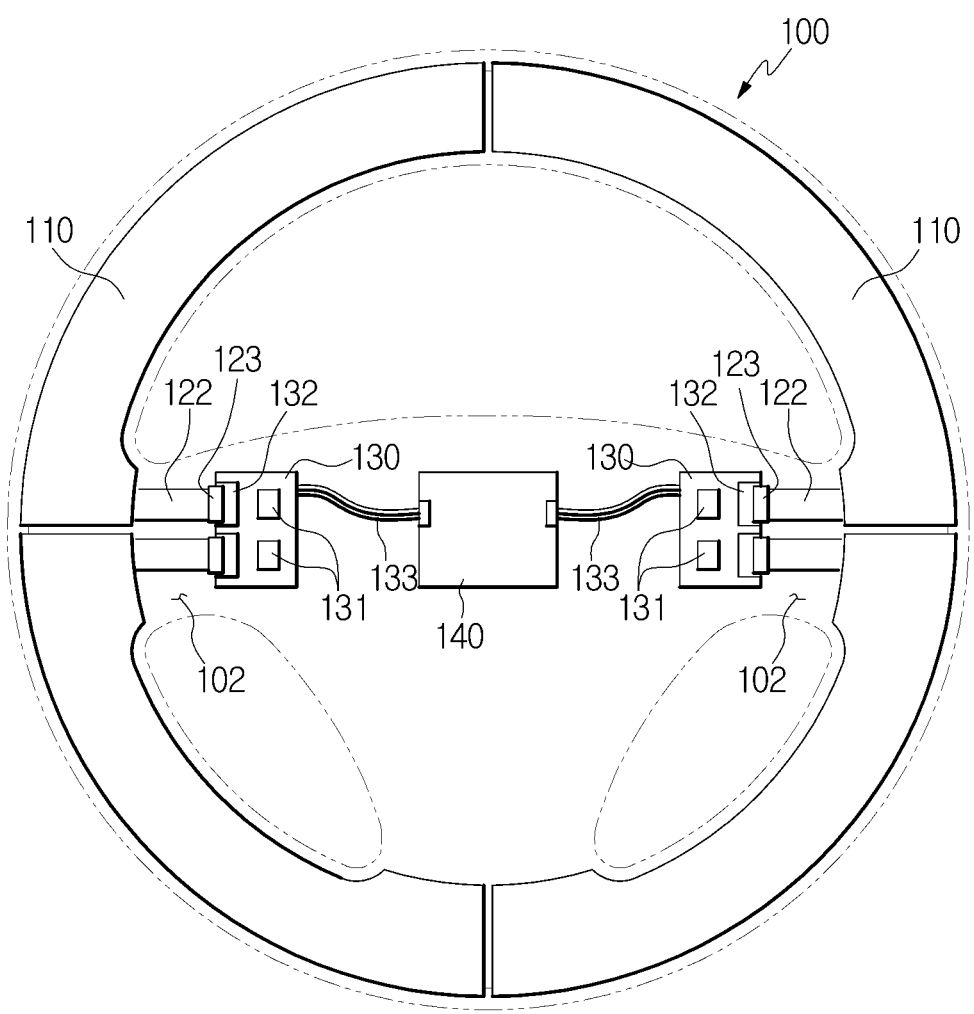
FIG. 1 schematically shows the inside of a steering wheel, according to an embodiment of the present disclosure.

Like numerals refer to like elements throughout the specification. Not all elements of embodiments of the present disclosure will be described, and description of what are commonly known in the art or what overlap each other in the embodiments will be omitted. The terms as used throughout the specification, such as "~part", "~module", "~member", "~block", etc., may be implemented in software and/or hardware, and a plurality of "~parts", "~modules", "~members", or "~blocks" may be implemented in a single element, or a single "~part", "~module", "~member", or "~block" may include a plurality of elements.

It will be further understood that the term "connect" or its derivatives refer both to direct and indirect connection, and the indirect connection includes a connection over a wireless communication network.

The term "include (or including)" or "comprise (or comprising)" is inclusive or open-ended and does not exclude additional, unrecited elements or method steps, unless otherwise mentioned.

Throughout the specification, when it is said that a member is located "on" another member, it implies not only that the member is located adjacent to the other member but also that a third member exists between the two members.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section.

It is to be understood that the singular forms "a," "an," and "the" include plural references unless the context clearly dictates otherwise.

Reference numerals used for method steps are just used for convenience of explanation, but not to limit an order of the steps. Thus, unless the context clearly dictates otherwise, the written order may be practiced otherwise.

Embodiments of the present disclosure will now be described with reference to accompanying drawings.

Figure 2:
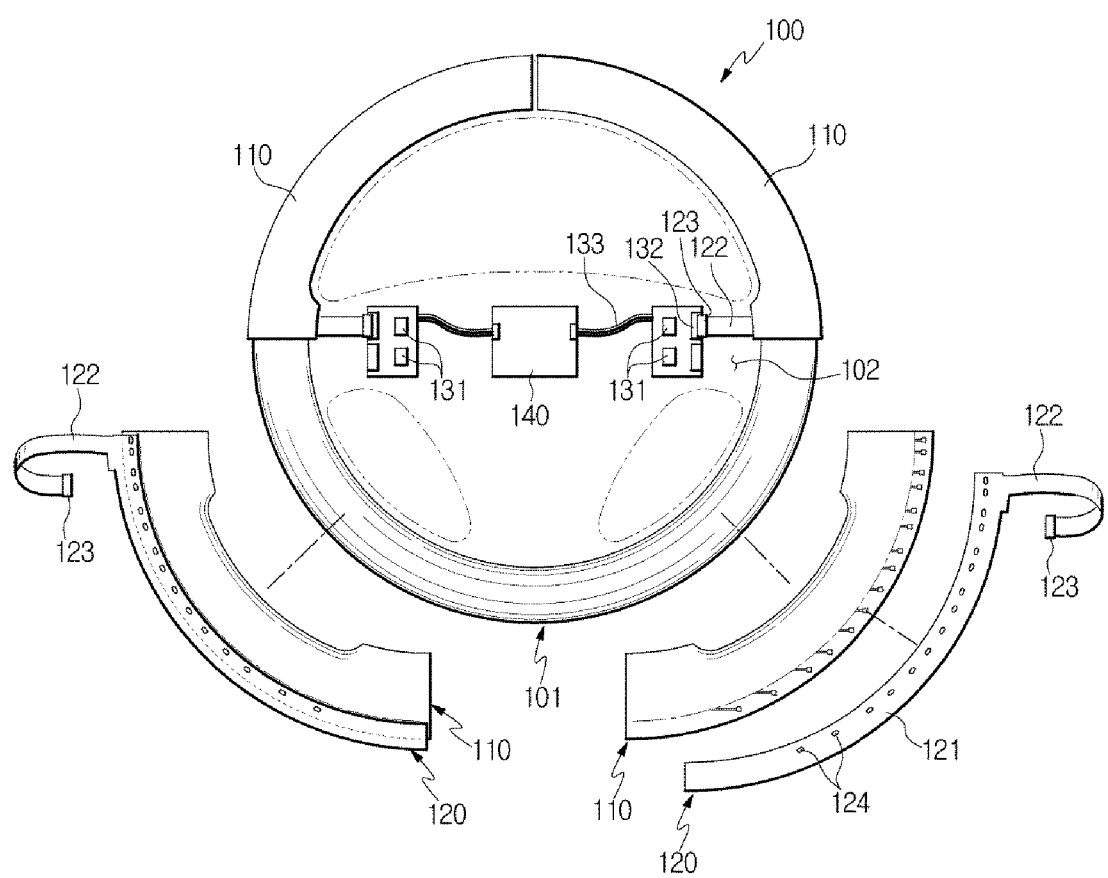
FIG. 2 shows a partially disassembled view of the steering wheel of FIG. 1.
Figure 3:
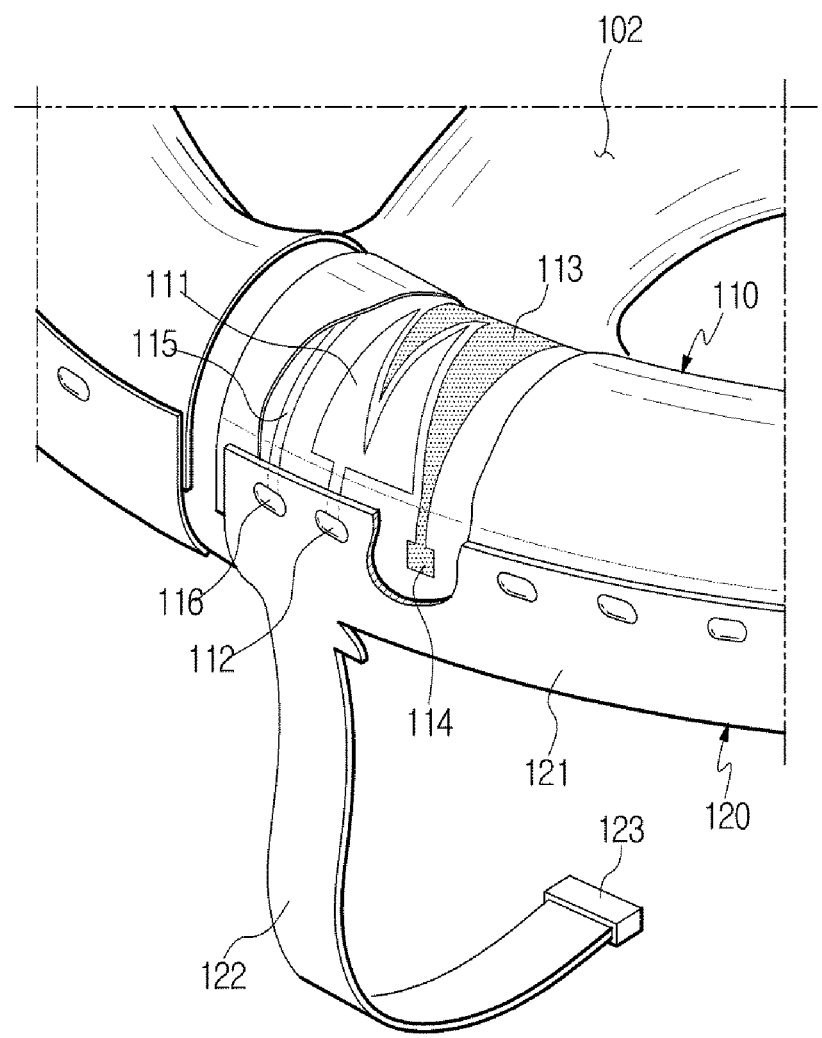
FIG. 3 is an enlarged view of a part of a steering wheel, according to an embodiment of the present disclosure.

FIG. 1 schematically shows the inside of a steering wheel, according to an embodiment of the present disclosure, and FIG. 2 shows a partially disassembled view of the steering wheel of FIG. 1. FIG. 3 is an enlarged view of a part of a steering wheel, according to an embodiment of the present disclosure.

Referring to FIGS. 1 and 2, a steering wheel 100 in accordance with an embodiment may include a wheel frame 101, a base 110 provided to cover the wheel frame 101, a connector 120 coupled to the base 110, a printed circuit board 130, and a sensor integrated circuit (IC) 131 mounted on the printed circuit board 130.

The wheel frame 101 may include a donut-shaped rim, and a spoke coupling the center axis of the steering wheel 100 with the wheel frame 101.

Although three spokes are shown in the drawings, they are by way of example and the number of the spokes may be determined according to a design specification.

The rim may serve as a grip of the steering wheel 100. The driver may typically hold the rim with one or both hands to manipulate the steering wheel 100. Accordingly, whether the steering wheel 100 is held by the driver may be detected based on the detection whether the driver holds the rim. As will be described later, the steering wheel 100 may have a sensor electrode cover the rim of the wheel frame 101. Accordingly, the steering wheel 100 may sense whether the driver touches the sensor electrode on the rim. Based on whether the driver touches the sensor electrode, whether the steering wheel 100 is held by the driver may be detected or determined. That is, the sensor electrode of the rim may function as a touch input device.

Referring to FIG. 3, the base 110 may include sensor electrodes 111 to 114. The base 110 may also include a masking layer provided to cover the sensor electrodes 111 to 114. The masking layer may be formed on the outer surface of the base 110 to prevent the sensor electrodes 111 to 114 from being directly exposed and damaged by external shocks.

The base 110 may include the sensor electrodes 111 to 114. The base 110 may be made of a substance including a metal complex. A Laser Directing Structure (LDS) method is used to form the sensor electrodes 111 to 114. The LDS method refers to a method of forming a conductive structure in a region of a support member exposed to laser by forming the support member with a material including a non-conductive and chemically stable metal complex, exposing a metal seed by exposing the portion of the support member to laser, such as Ultra Violet (UV) laser or Excimer laser to break chemical bonding of the metal complex, and metalizing the support member.

The base 110 may include an electrode groove (not shown). The electrode groove may be formed by irradiating laser on the base 110. The electrode groove may go through a plating or deposition process. The sensor electrodes 111 to 114 may be plating conductive layers or deposition conductive layers respectively filling the electrode grooves in the base.

The outer surface of the wheel frame 101 may have a curved plane. Specifically, the outer surface of the rim of the wheel frame 101 may be curved. The base 110 may be coupled to the wheel frame 101 to cover the rim of the wheel frame 101. Since the sensor electrodes 111 to 114 are formed in the LDS method, they may reliably operate even when the base 110 is coupled to a polygonal surface or curved surface.

Although not shown, a steering wheel cover (not shown) may be coupled to the wheel frame 101 to cover the wheel frame 101 after the wheel frame 101 is coupled to the base 110 and the connector 120.

The steering wheel cover may form the exterior of the steering wheel 100 and may be made of a non-conductive material. Other various materials may be used for the steering wheel cover. For example, the steering wheel cover may be made of leather.

As shown in FIG. 3, the base 110 may be arranged to cover the top and part of sides of the rim. The top of the rim may refer to a face directed to the driver.

Alternatively, the base 110 may cover the rear side of the rim as well as the top and sides of the rim. However, it is often the case that the driver mainly touches the front and sides of the steering wheel while holding the steering wheel, so it may be desirable for the base 110 to cover the top and part of the sides of the rim for cost-saving. With this structure, the area of the sensor electrodes 111 to 114 formed on the base 110 may be reduced.

The connector 120 may be coupled with the base 110. The connector 120 may be provided as a flexible printed circuit board (FPCB). The connector 120 may be coupled with the base 110 by soldering. Although not shown, the connector 120 may further include a wiring part (not shown) arranged to electrically connect the sensor electrodes 111 to 114 formed on the base 110 to the sensor ICs 131 mounted on the printed circuit board 130.

The connector 120 may include a body part 121 provided to be coupled with the base 110, an extension 122 extending from a side of the body part 121, and a contact part 123 arranged at one end of the extension 122 to come into contact with the printed circuit board 130.

The body part 121 may include a plurality of couplers 124. The couplers 124 may be provided to be connected and coupled to ends 112 and 114 of the sensor electrodes, which will be described later, by soldering. Since the couplers 124 and the ends 112 and 114 of the sensor electrodes are coupled by soldering, the wiring part of the connector 120 and the sensor electrodes of the base 110 may be electrically connected.

The extension 122 may be coupled with the printed circuit board 130 through the sides and back of the wheel frame 101. The extension 122 may extend from the body part 121 to connect the body part 121 and the printed circuit board 130. There are no limitations on the position of the extension 122, but may be arranged on one side of the body part 121, which is near the spoke 102 in order to reduce the distance to the printed circuit board 130 arranged in the spoke 102.

The connector 120 may include the contact part 123 arranged at one end of the extension 122. The contact part 123 may be provided to be coupled to a board contact part 132 arranged on the printed circuit board 130. Once the contact part 123 is coupled to the board contact part 132, the base 110 and the printed circuit board 130 may be electrically connected via the connector 120. In this embodiment, the contact part 123 may be detachably coupled with the board contact part 132. It is not, however, limited thereto. For example, the extension 122 may be directly coupled with the printed circuit board 130 by soldering without need for the contact part and the board contact part.

The printed circuit board 130 may include the sensor ICs 131 and the board contact part 132. The sensor ICs 131 may be electrically connected to the plurality of sensor electrodes 111 to 114 to detect an amount of change in capacitance of each sensor electrode 111 to 114. The sensor IC 131 may sense whether the driver is approaching or touching the sensor electrode 111 to 114.

The board contact part 132 may be provided to be coupled to the contact part 123 as described above. The board contact part 132 may be connected to the sensor ICs 131. The sensor electrodes 111 to 114 are electrically connected to the board contact part 132 through the wiring part and the contact part 123 of the connector 120, and the board contact part 132 is electrically connected to the sensor ICs 131. Accordingly, the sensor electrodes 111 to 114 may be electrically connected to the sensor ICs 131.

Although not shown, the connector 120 may be integrated with the base 110. The wiring part may be formed by the same LDS method as for the sensor electrodes 111 to 114. This may omit an extra soldering process to couple the connector and the base. Furthermore, similar to the sensor electrodes 111 to 114, the wiring part may be protected from external shocks due to the masking layer.

Again, the rim may substantially have the form of a donut. The rim may have an inner side and an outer side. The inner side corresponds to a face of the rim coupled with the spoke.

The wiring part may be arranged in the inner side of the rim. When the driver holds the steering wheel 100, the fingers of the driver do not normally reach the inner side of the rim. Hence, the inner side of the rim is not usually damaged by the driver's body. Furthermore, since the inner side is not reached by the driver's body, there is less need to arrange the sensor electrode on the inner side. With this feature, it is desirable to arrange the wiring part in the inner side of the rim. If the wiring part is damaged, electric connection between the sensor electrode and the sensor IC fails, and the sensor electrode may not normally operate. With the wiring part arranged in the inner side of the rim, it is less likely for the driver to damage the wiring part because the inner side of the rim is not usually reached by the driver's body. Furthermore, there is less need to arrange the sensor electrode for detecting touches of the driver on the inner side of the rim because the inner side is not reached by the driver's body. In addition, the sensor electrodes may be arranged more widely in other areas by arranging the wiring part in the inner side of the rim.

In an embodiment, each of the base 110 and the connector 120 may be arranged in the plural. For example, as shown in FIGS. 1 and 2, there may be four bases 110 and four connectors 120. The sensor ICs 131 may also be arranged in the plural to correspond to the number of the bases 110 and the connectors 120. For example, there may be four sensor ICs 131 as shown in the drawings. The printed circuit board 130 may include the plurality of sensor ICs 131 and there may be less number of printed circuit boards 130 than the number of sensor ICs 131. For example, as shown in the drawings, there may be two printed circuit boards 130.

The steering wheel 100 may include a controller 140 for controlling the plurality of sensor ICs 131. The controller 140 may be provided on a separate printed circuit board. In this case, the controller 140 may be coupled to the printed circuit board 130 by a flexible printed circuit board 133. Alternatively, the controller 140 may be provided on the printed circuit board 130 with the sensor ICs 131. As shown in the drawings, the controller 140 may be arranged in the center of the steering wheel 100, without being limited thereto. The controller 140 may be arranged inside the vehicle.

The controller 140 may include a processor for controlling the plurality of sensor ICs 131 and a memory for storing data. The controller 140 may be implemented in one or more modules, or implemented by being combined with a head unit that controls various components of the vehicle, such as the navigation system, the audio system, and the air conditioner.

The memory may store a program and data for controlling the sensor ICs 131 and temporarily store control data produced while controlling the sensor ICs 131.

The memory may include a non-volatile memory, such as a Read Only Memory (ROM), a flash memory, and/or the like, which may store data for a long period, and a volatile memory, such as a static random access memory (SRAM), a dynamic RAM (DRAM), or the like, which may temporarily store data.

The processor may include a microprocessor, a digital signal processor (DSP), or the like, and may be provided with one or more chips. The processor may include an operation circuit for performing logic operation and arithmetic operation, and a memory circuit for storing the data resulting from the operation circuit.

A detailed control procedure of the controller 140 will be described later.

Figure 4:
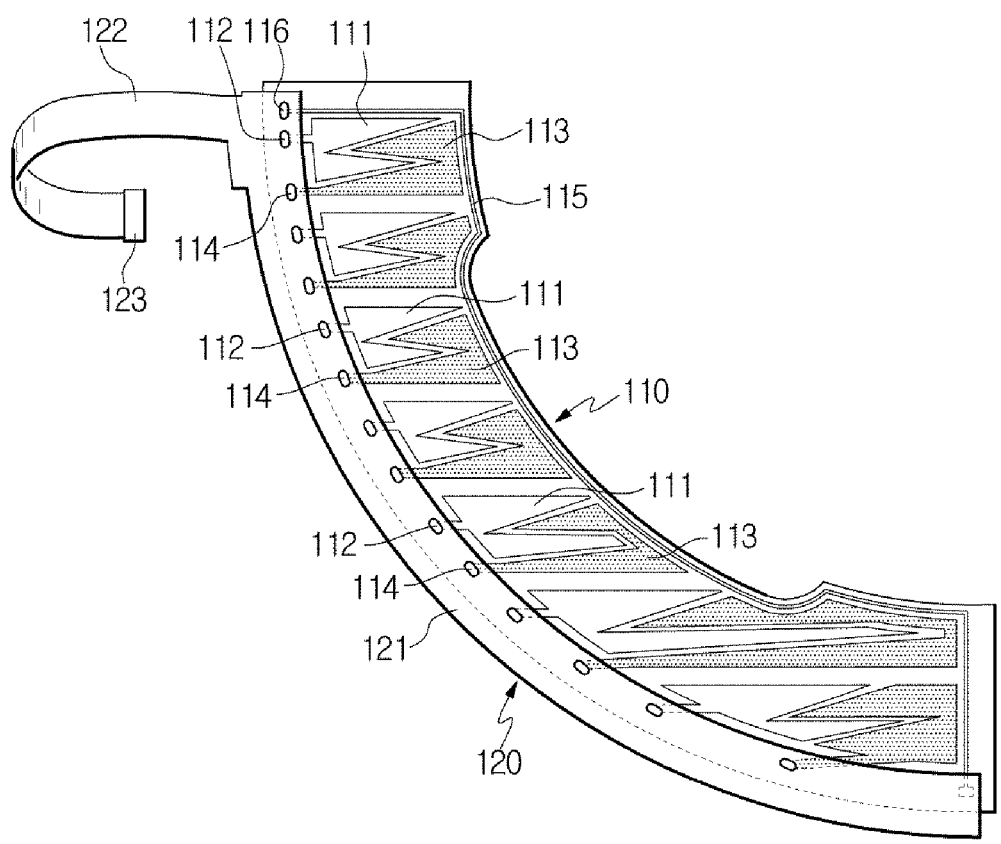
FIG. 4 shows a base and a connector of a steering wheel, according to an embodiment of the present disclosure.

FIG. 4 shows a base and a connector of a steering wheel, according to an embodiment of the present disclosure.

Referring to FIG. 4, the base 110 may include the plurality of sensor electrodes 111 to 114. The base 110 may include a ground electrode 115 and 116 provided to adjust sensing areas of the sensor electrodes 111 to 114. With the sensor electrodes 111 to 114 arranged in different areas on the base 110, the driver may make touch inputs in different sensing areas.

As described above, the base 110 may be made of a substance including a metal complex. The sensor electrodes 111 to 114 may be formed by exposing the base 110 to laser to break chemical bonding of the metal complex and expose the metal seeds and metalizing the exposed metal seeds.

The plurality of sensor electrodes 111 to 114 may have a certain pattern. The sensor electrodes 111 to 114 may include a plurality of first sensor electrodes 111 and 112 and a plurality of second sensor electrodes 113 and 114.

The first sensor electrode 111 and 112 and the second sensor electrode 113 and 114 may be arranged not to overlap each other. The first sensor electrode 111 and 112 and the second sensor electrode 113 and 114 may be arranged on the same layer, but spaced apart from each other. The first sensor electrode 111 and 112 and the second sensor electrode 113 and 114 may have a protruding region and a concave region, respectively, to enhance sensing capability in relation to the number of the sensor electrodes 111 to 114. As shown in FIG. 4, the protruding region and the concave region may substantially have triangular forms.

The first sensor electrode 111 and 112 and the second sensor electrode 113 and 114 may employ a self capacitance method. In the self capacitance method, the first sensor electrode 111 and 112 and the second sensor electrode 113 and 114 may each serve as an independent sensor having a sensing ability. Each sensor electrode measures a capacitance between the surface of the sensor electrode and a body part, such as a finger. The measured capacitance increases as the driver and the sensor electrode become closer.

Alternatively, the first sensor electrode 111 and 112 and the second sensor electrode 113 and 114 may employ a mutual capacitance method. In this case, if the first sensor electrode 111 and 112 is a transmitter (TX) electrode, the second sensor electrode 113 and 114 may be a receiver (RX) electrode, or if the first sensor electrode 111 and 112 is an RX electrode, the second sensor electrode 113 and 114 may be a TX electrode. In the mutual capacitance method, a capacitance created between the first sensor electrode 111, 112 and the second electrode 113, 114 is measured. The capacitance decreases as a body part of the driver, such as a finger approaches the sensor electrode.

The end 112 of the first sensor electrode and the end 114 of the second sensor electrode may be coupled with the couplers 124 of the connector 120 by soldering.

The ground electrode 115 and 116 may be formed around the edges of the sensor electrodes 111 to 114. With the structure, a sensing area of the sensing electrode 111 to 114 may be adjusted to a direction perpendicular to the sensor electrode 111 to 114, and thus the frequency of noise occurrence may be reduced.

Similar to the ends 112, 114 of the sensor electrodes, the end of the ground electrode 116 may be coupled with the coupler 124 of the connector 120 by soldering.

Figure 5:
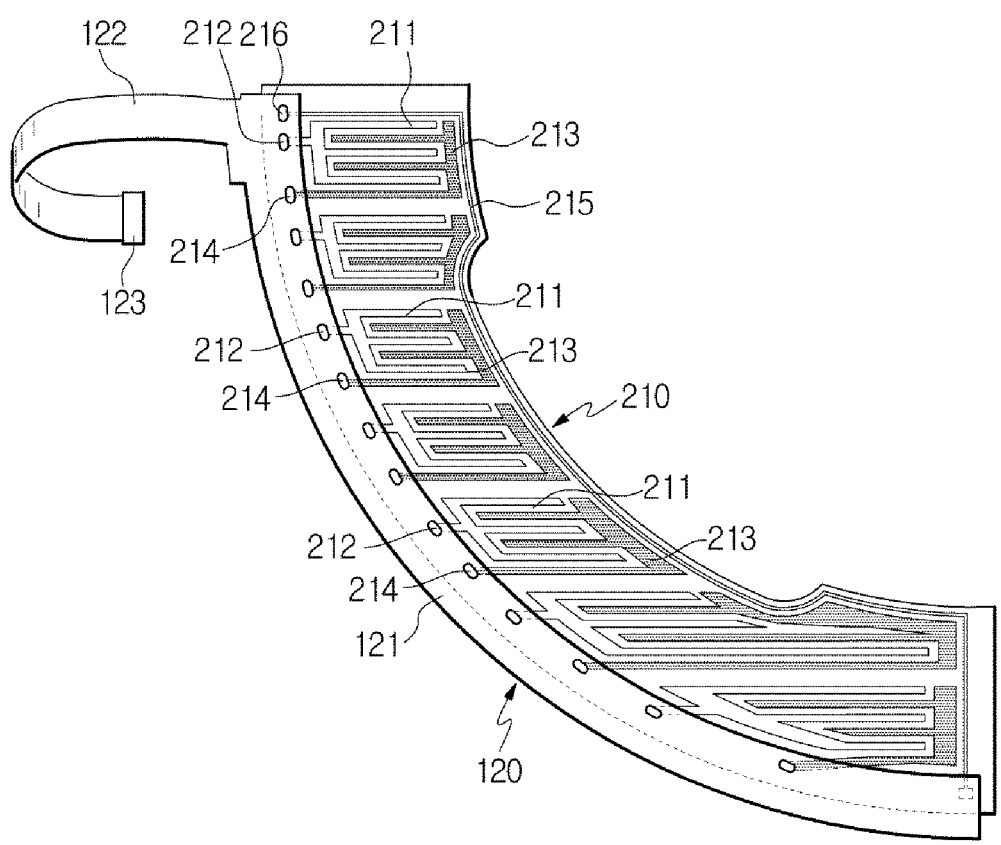
FIG. 5 shows a base and a connector of a steering wheel, according to another embodiment of the present disclosure.

FIG. 5 shows a base and a connector of a steering wheel, according to another embodiment of the present disclosure.

Referring to FIG. 5, a base 210 may include a plurality of sensor electrodes 211 to 214 and a ground electrode 215 and 216.

The sensor electrodes 211 to 214 are the same as the sensor electrodes 111 to 114 in the previous embodiment, except for the shape.

As shown in FIG. 5, a first sensor electrode 211 and 212 and a second sensor electrode 213 and 214 may have a certain pattern. The first sensor electrode 211 and 212 and the second sensor electrode 213 and 214 may be arranged not to overlap each other.

The sensor electrodes 211 to 214 may be formed by irradiating laser onto the base 210 having a metal complex to expose metal seeds and metalizing the metal seeds.

The first sensor electrode 211 and 212 and the second sensor electrode 213 and 214 may have a protruding region and a concave region, respectively, and the protruding region and the concave region may substantially have rectangular forms.

The end 212 of the first sensor electrode and the end 214 of the second sensor electrode may be coupled with the couplers 124 of the connector 120 by soldering.

The ground electrode 215 and 216 may be formed around the edges of the sensor electrodes 211 to 214. With the structure, a sensing area of the sensing electrode 211 to 214 may be adjusted to a direction perpendicular to the sensor electrode 211 to 214, and thus the frequency of noise occurrence may be reduced.

Similar to the ends 212, 214 of the sensor electrodes, the end of the ground electrode 216 may be coupled with the coupler 124 of the connector 120 by soldering.

A procedure of the controller 140 of the steering wheel in accordance with an embodiment of the present disclosure determining a touch input of the driver based on a detection result of the sensor IC 131 and activating or deactivating touch areas for manipulation of the sensor electrodes 111 to 114 will now be described in connection with FIG. 6.

Figure 6:
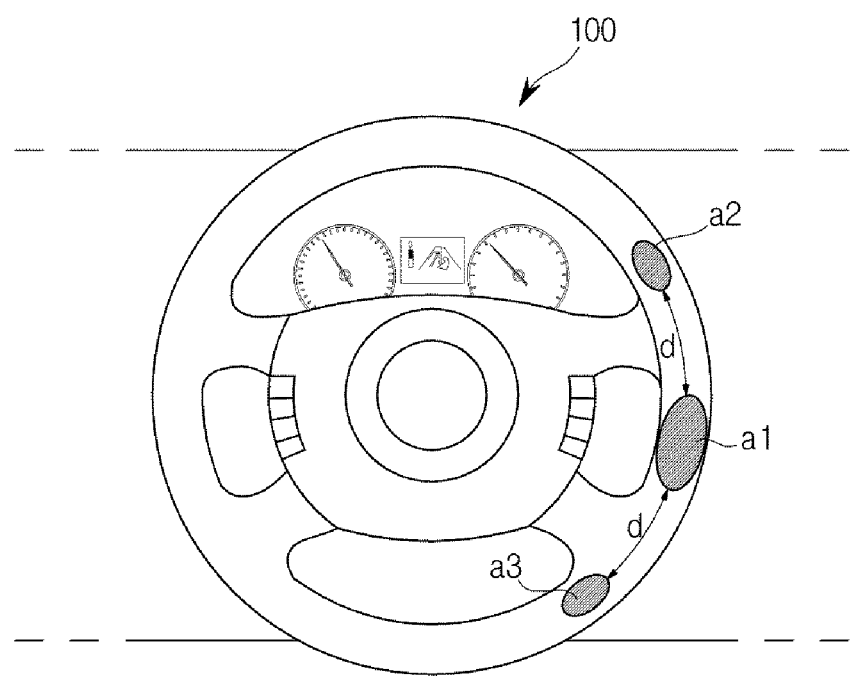
FIG. 6 shows touch areas on a steering wheel.
Figure 7A:
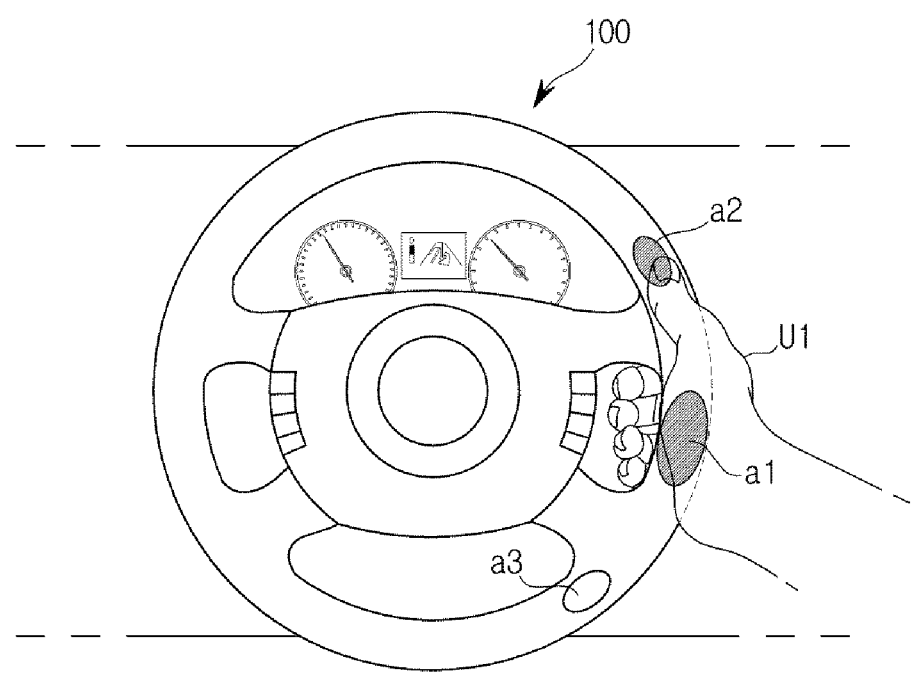
FIGS. 7A and 7B show the driver's gestures to manipulate a steering wheel.
Figure 7B:
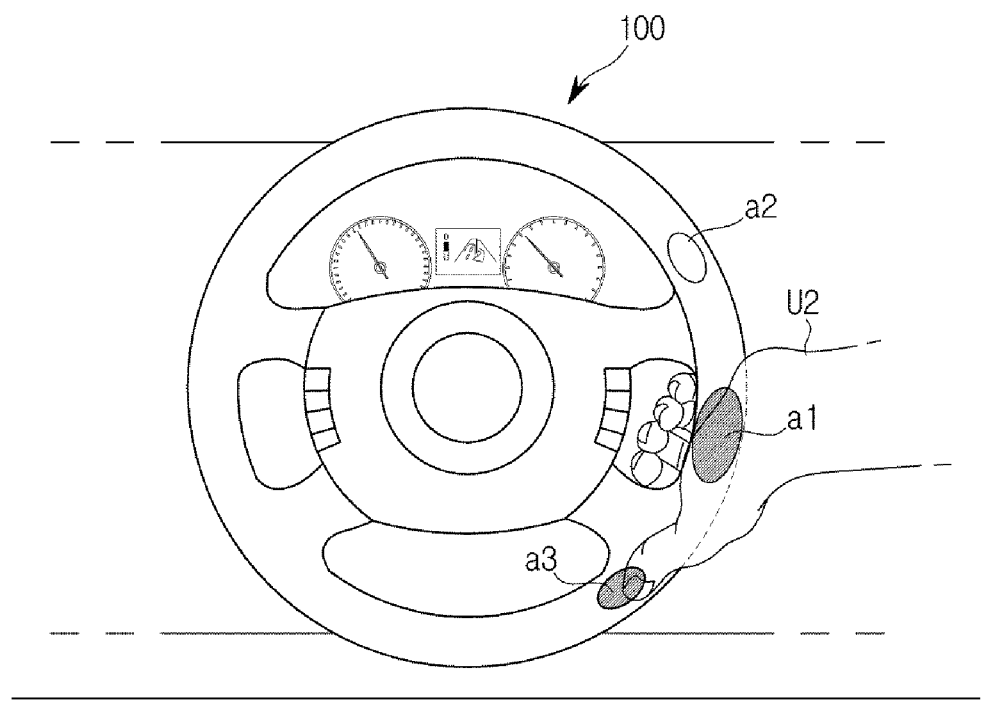

FIG. 6 shows touch areas on a steering wheel, and FIGS. 7A and 7B show the driver's gestures to manipulate a steering wheel.

Since the steering wheel 100 may be easily manipulated by the driver behind the wheel, the steering wheel 100 may receive various commands from the driver through the plurality of sensor electrodes 111 to 114 arranged on the base 110, such as a command to select information to be displayed on the cluster or the Audio Video Navigation (AVN) of the vehicle, a command to control the cluster or the AVN, or other various commands to operate internal components of the vehicle. The touch area for manipulation refers to a touch input area for the driver to input such various commands.

The controller 140 may determine whether a touch input is received from the driver based on an amount of change in capacitance of each sensor electrodes 111 to 114. The controller 140 may then determine whether the touch input from the driver is a palm touch input or a finger touch input based on a touch area of each sensor electrode 111 to 114, in which the touch input has been entered by the driver.

Specifically, the controller 140 may determine that the touch input is the palm touch input if the number of the sensor electrodes 111 to 114 having received the touch input of the driver exceeds a predetermined reference number, or determine that the touch input is the finger touch input if the number of the sensor electrodes 111 to 114 having received the touch input of the driver does not exceed the predetermined reference number.

In this case, the controller 140 may detect a touch input signal using a low pass filter to determine the palm touch input and a high pass filter to determine the finger touch input.

If the touch input is determined to be the palm touch input, the controller 140 may set the touch area to a blob area a1, set up touch areas for manipulation a2, a3 based on the blob area a1, and activate the touch areas a2, a3 for manipulation.

For example, the touch areas a2, a3 for manipulation may be two partial areas a2, a3 separated by a preset offset d from the blob area a1. The preset offset d may be a value set in a manufacturing stage, a value manually entered by the driver beforehand, or a value set by learning of the controller 140.

As the controller 140 activates the touch areas a2, a3 for manipulation, the driver may be able to enter various commands into the touch areas a2, a3 for manipulation to operate internal components of the vehicle.

In the touch areas a2 a3 for manipulation, there may be one or more sensor electrodes 111 to 114. Accordingly, as the driver makes a touch input onto any of the sensor electrodes 111 to 114 in the touch area a2 or a3 for manipulation, various touch manipulation may be made.

Activation or deactivation of the touch area a2 or a3 for manipulation means activating or deactivating one or more of the sensor electrodes 111 to 114 located in the touch area a2 or a3 for manipulation by controlling the sensor IC 131. For example, the controller 140 may control the sensor ICs 131 to supply or cut off voltage to the sensor electrodes 111 to 114 in order to activate or deactivate the sensor electrodes 111 to 114.

Meanwhile, as shown in FIG. 7A, when the driver enters a command using his/her right hand U1, a finger of the right hand U1 is placed on the touch area a2 for manipulation in an upper area counterclockwise from the blob area a1. Accordingly, if a touch input is received in the touch area a2 for manipulation in the upper area counterclockwise from the blob area a1, the controller 140 may deactivate the touch area a3 for manipulation in a lower area clockwise from the blob area a1.

By deactivating the touch area a3 for manipulation in the lower area clockwise from the blob area a2, unnecessary power consumption may be saved.

On the contrary, as shown in FIG. 7B, when the driver enters a command using his/her left hand U2, a finger of the left hand U2 is placed on the touch area a3 for manipulation in the lower area clockwise from the blob area a1. Accordingly, if a touch input is received in the touch area a3 for manipulation in the lower area clockwise from the blob area a1, the controller 140 may deactivate the touch area a2 for manipulation in the upper area counterclockwise from the blob area a1.

The controller 140 may set a new offset by learning about points within the touch areas a2, a3 for manipulation, at which touch inputs have been received.

Figure 8A:
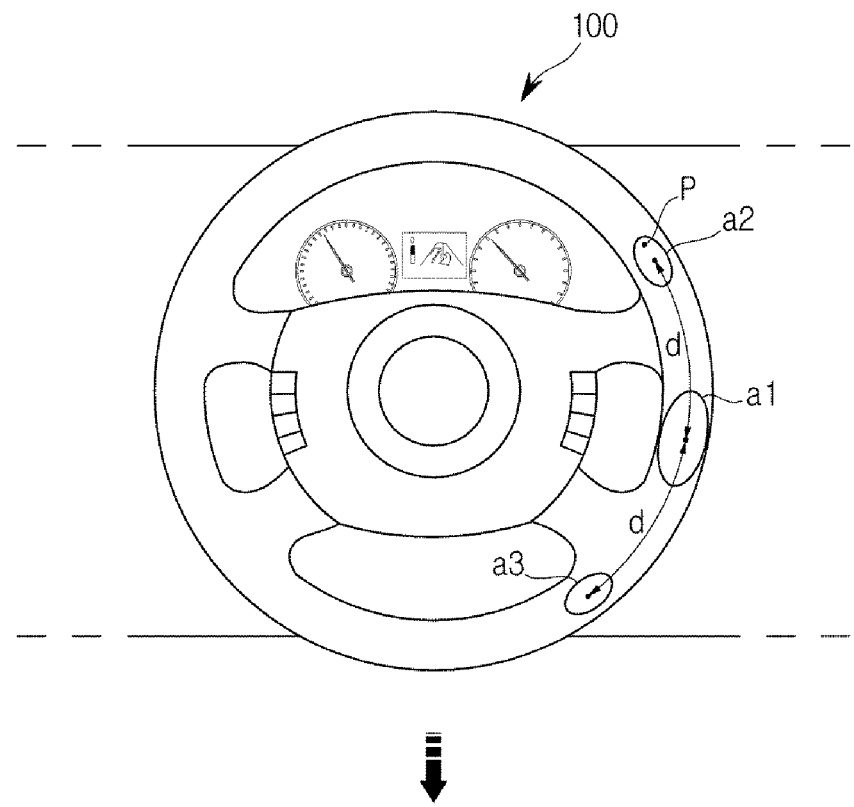
FIGS. 8A and 8B are conceptual diagrams for explaining an offset newly set through learning.
Figure 8A:
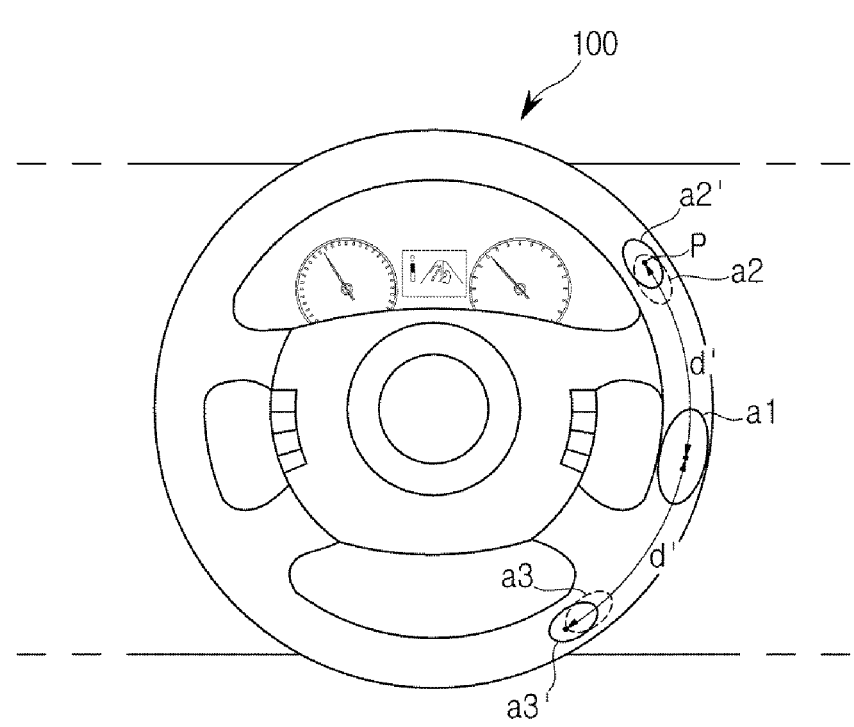
Figure 8B:
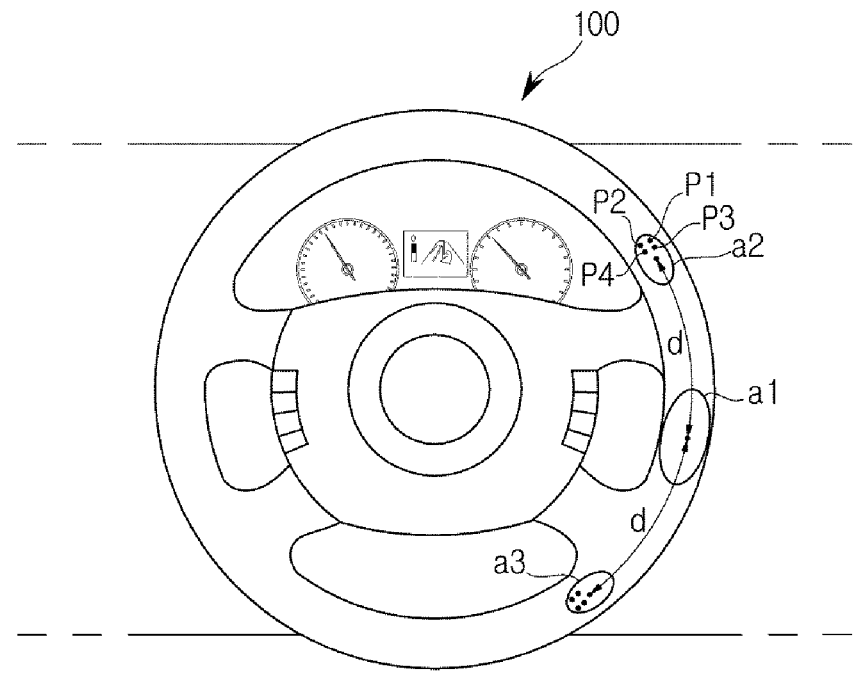
Figure 8B:
Figure 8B:
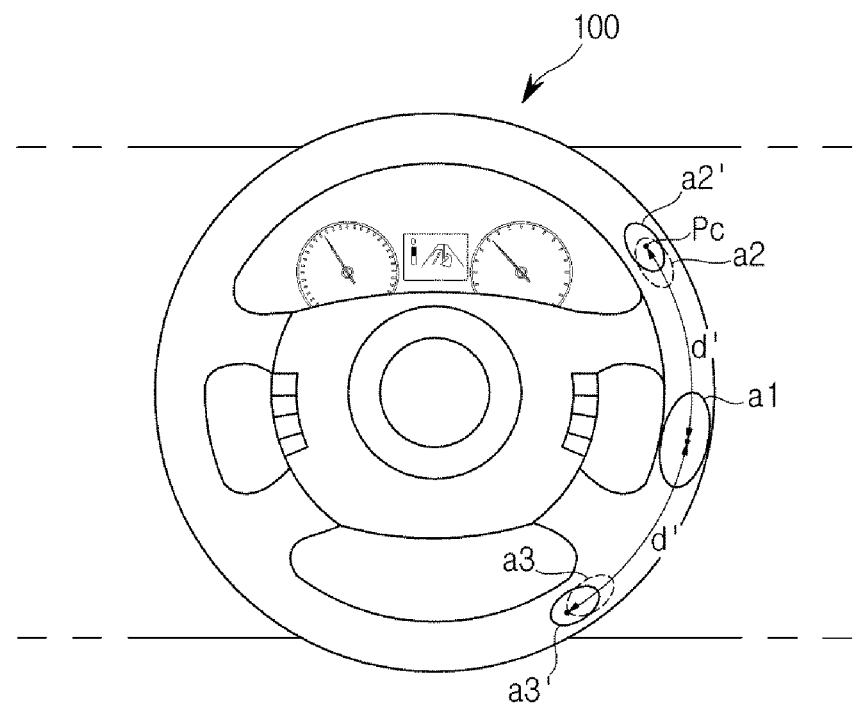

FIGS. 8A and 8B are conceptual diagrams for explaining an offset newly set through learning.

Referring to FIG. 8A, if a touch input is received in the single touch area a2 for manipulation, the controller 140 may change a setting value of the offset d based on a point at which the touch input has been received. In this case, the controller 140 may set a distance from a point in the blob area a1 to a point p, at which the touch input has been received, to the new offset d'.

For example, if a touch input is received at a point p in the touch area a2 for manipulation above the blob area a1, the controller 140 may set a distance from a center point of the blob area a1 to the point p, at which the touch input has been received, to the new offset d'.

The offset d may be expanded or reduced depending on the point, at which the touch input has been received, and accordingly, the touch areas a2, a3 for manipulation may also be changed (into a2', a3', respectively).

Furthermore, referring to FIG. 8B, if a touch input is received multiple times in the single touch area a2 for manipulation, the controller 140 may change a setting value of the offset d based on a plurality of points p1~p4, at which the touch input has been received. In this case, the controller 140 may set a distance from a point in the blob area a1 to a center point pc of the plurality of points p1~p4 at which the touch input has been received to the new offset d'.

For example, if the touch input is received at the plurality of points p1~p4 in the touch area a2 for manipulation in the upper area from the blob area a1, the controller 140 may set a distance from the center point of the blob area a1 to the center point pc of the plurality of points p1~p4, at which the touch input has been received, to the new offset d'.

Such a newly set offset d' may be stored in a memory to be used by the controller 140 in a subsequent process of setting up a touch area for manipulation. The touch areas a2, a3 for manipulation may be changed into a2', a3', respectively.

Although an occasion when the driver makes a touch input on the right side of the steering wheel 100 was described as an example in the above embodiment, the driver may make a touch input with his/her left hand on the left side of the steering wheel 100, in which case, the touch input is received in a touch area for manipulation in an upper area clockwise from the blob area, and the controller 140 may deactivate a touch area for manipulation in a lower area counterclockwise from the blob area. On the contrary, if the driver may make a touch input with his/her right hand on the left side of the steering wheel 100, the touch input is received in a touch area for manipulation in a lower area counterclockwise from the blob area, and the controller 140 may deactivate a touch area for manipulation in the upper area clockwise from the blob area.

Besides, the driver may make touch inputs at any points on the steering wheel 100, so the present disclosure is not limited to the aforementioned embodiments.

In the meantime, if no touch input has been received in an activated touch area for manipulation for over a preset first reference period of time (e.g., 5 seconds), the controller 140 may activate even the remaining touch area(s) for manipulation that has (have) been deactivated.

However, if any touch input has not been received, i.e., there has been no palm grip in the blob area for over a preset second reference period of time (e.g., 10 seconds), all the touch areas for manipulation are deactivated. It may be determined whether there is a new touch input received through the touch input part again from the driver, and a blob area may be set up again based on a touch area of the touch input part, in which the touch input has been received.

At least one component may be added or deleted to correspond to the performance of the components of the steering wheel 100. Furthermore, it will be obvious to the ordinary skilled people in the art that the relative positions of the components may be changed to correspond to the system performance or structure.

Some components of the steering wheel 100 may be implemented in software, or hardware such as Field Programmable Gate Arrays (FPGSs) and Application Specific Integrated Circuits (ASICs).

Figure 9:
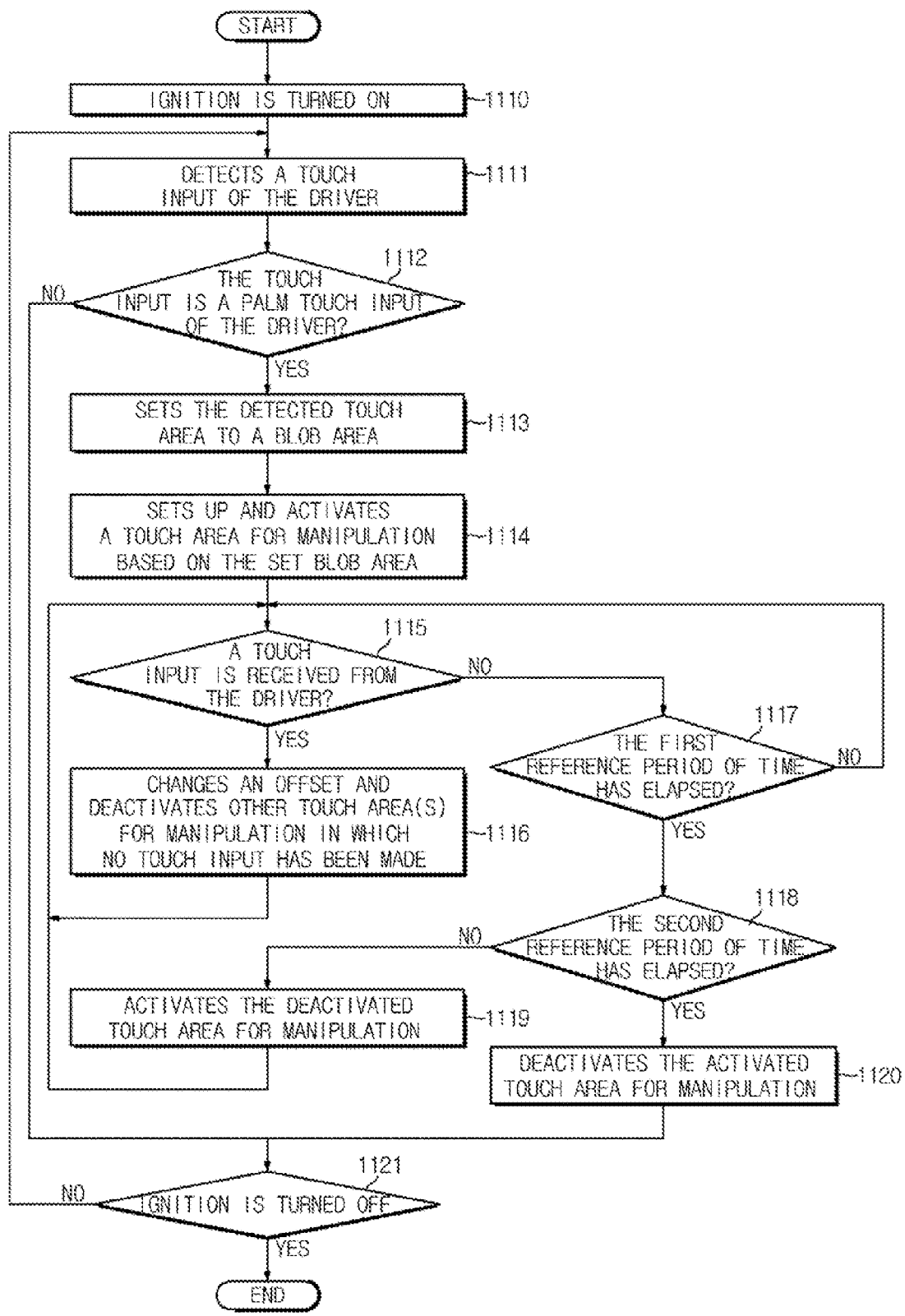
FIG. 9 is a flowchart illustrating a method for controlling a steering wheel, according to an embodiment of the present disclosure.

A method for controlling the steering wheel 100 in accordance with an embodiment of the present disclosure will now be described with reference to FIG. 9. FIG. 9 is a flowchart illustrating a method for controlling a steering wheel, according to an embodiment of the present disclosure.

Since components of the steering wheel 100 as will be mentioned below are the same as those of the steering wheel 100 as described in connection with FIGS. 1 to 8B, the same reference numerals will be used in the following description.

First, referring to FIG. 9, after a vehicle is started in 1110, at least one of the sensor electrodes 111 to 114 detects a touch input of the driver in 1111, and the controller 140 determines whether the touch input is a palm touch input of the driver in 1112.

Detecting a touch input of the driver may include detecting the touch input based on an amount of change in capacitance of at least one sensor electrodes 111 to 114. For example, if the change in capacitance is greater than a preset threshold, the controller 140 may determine that a touch input has been made.

Determining whether the touch input is a palm touch input may be made by the controller 140 based on the number of the sensor electrodes 111 to 114 that have received a touch input. For example, the controller 140 may determine that the touch input is the palm touch input if the number of the sensor electrodes 111 to 114 having received the touch input of the driver exceeds a predetermined number, or determine that the touch input is the finger touch input if the number of the sensor electrodes 111 to 114 having received the touch input of the driver does not exceed the predetermined number.

Determining whether the touch input is a palm touch input of the driver may include having the touch input signal pass the low pass filter to detect a palm touch input signal, or pass the high pass filter to detect a finger touch input signal.

If the touch input is determined to be the palm touch input in 1112, the controller 140 sets the detected touch area to a blob area in 1113. On the other hand, if the touch input is not determined to be the palm touch input in 1112, the controller 140 performs a procedure of receiving a touch input of the driver in 1111 and determining whether the touch input is a palm touch input until the ignition of the vehicle is turned off in 1121.

Setting the detected touch area to be a blob area may include, but not exclusively, for example, setting a touch area of the sensor electrodes 111 to 114 having received a touch input to a blob area, or setting a touch area of the sensor electrodes 111 to 114 having received a touch input and an area of the surrounding sensor electrodes 111 to 114 to a blob area.

The controller 140 then sets up a touch area for manipulation based on the set blob area and activates the touch area for manipulation, in 1114.

The touch area for manipulation may be one or more areas separated as far as a preset offset from the blob area.

For example, the controller 140 may set two areas an offset away from the blob area in the opposite directions to the touch area for manipulation.

The preset offset may be a value set in a manufacturing stage, a value manually entered by the driver beforehand, or a value set by learning of the controller 140.

Once the controller 140 activates a touch area for manipulation, the driver may be able to enter various commands to the touch area for manipulation. For example, the driver may select a content displayed on the AVN or the cluster by making a touch input on the touch area for manipulation.

The controller 140 then determines whether a touch input is made by the driver in the touch area for manipulation, in 1115.

Determining whether a touch input is made by the driver may include determining a touch area for manipulation in which a touch input is made in a case that a plurality of touch areas for manipulation are set up.

If a touch input is received from the driver in 1115, the controller 140 changes an offset (i.e., learns an offset) based on a point at which the touch input has been received, and deactivates other touch area(s) for manipulation in which no touch input has been made, than the touch area for manipulation in which the touch input has been made in the case that a plurality of touch areas for manipulation are set up, in 1116. How to change an offset was described above in connection with FIGS. 8A and 8B, so the description thereof will not repeated.

The controller 140 may keep the activated touch area for manipulation as it is if there are continuous touch inputs made in the activated touch area for manipulation, or may activate a deactivated touch area in 1119 if there has been no touch input made in the activated touch area for manipulation for a first reference period of time (i.e., the first reference period of time has elapsed without any touch input in 1117), thereby allowing all the plurality of touch areas for manipulation to be able to receive touch inputs.

The activation of the deactivated touch area for manipulation in 1119 may be performed until a second reference period of time, which is greater than the first reference period of time, has not elapsed.

On the other hand, if the second reference period of time has elapsed in 1117, 1118 without detection of any touch input in the activated touch area for manipulation in 1115, the controller 140 determines that there would be no more touch input to the sensor electrodes 111 to 114 and deactivates the activated touch area for manipulation, in 1120.

Even while the touch area for manipulation is deactivated, the touch input part may still detect whether there is a touch input of the driver until the ignition is turned off in 1121, and the controller 140 may change the blob area by detecting another palm touch input in 1112, as described above.

The embodiments of the present disclosure may be implemented in the form of non-transitory, or transitory, recording media for storing instructions to be carried out by a computer such as the controller. The instructions may be stored in the form of program codes, and when executed by a processor, may generate program modules to perform operation in the embodiments of the present disclosure. The recording media may correspond to computer-readable recording media.

The computer-readable recording medium includes any type of recording medium having data stored thereon that may be thereafter read by a computer such as the controller. For example, it may be a ROM, a RAM, a magnetic tape, a magnetic disk, a flash memory, an optical data storage device, etc.

According to embodiments of the present disclosure, a steering wheel may be provided with the rim of the steering wheel used as a touch input part.

Furthermore, the touch input part on the steering wheel provided in the vehicle may have increased usability and convenience and may allow inputting of various operation commands.

Several embodiments have been described above, but a person of ordinary skill in the art will understand and appreciate that various modifications can be made without departing the scope of the present disclosure. Thus, it will be apparent to those ordinary skilled in the art that the true scope of technical protection is only defined by the following claims.

What is claimed is:

1. A steering wheel comprising:
a wheel frame;
a base coupled to cover the wheel frame;
a sensor electrode arranged on the base and configured to receive a driver's touch input; and
a controller configured to set up a touch area for manipulation to control components of a vehicle based on a touch area of the sensor electrode having received the touch input,
wherein the controller is configured to set up a plurality of touch areas for manipulation, activate the plurality of touch areas for manipulation, and if at least one of the plurality of touch areas for manipulation receives a touch input, deactivate the rest of the plurality of touch areas for manipulation, in which no touch input is received.

2. The steering wheel of claim 1, wherein the controller is further configured to determine a palm touch input of the driver and set up the touch area for manipulation around a palm touch area having received the palm touch input.

3. The steering wheel of claim 1, wherein the controller is further configured to determine a palm touch input of the driver and set an area separated from a palm touch area having received the palm touch input by a preset offset to the touch area for manipulation.

4. The steering wheel of claim 3, wherein the controller is further configured to set two areas separated from the palm touch area having received the palm touch input by the preset offset in opposite directions to the touch area for manipulation.

5. The steering wheel of claim 3, wherein if a touch input is received in the touch area for manipulation, the controller is configured to change an offset based on a point at which the touch input is received in the touch area for manipulation.

6. The steering wheel of claim 5, wherein the controller is configured to change the offset based on a distance between the point at which the touch input is received and a point in the palm touch area.

7. The steering wheel of claim 1, wherein the controller is configured to activate a deactivated touch area for manipulation if the at least one of the plurality of touch areas receives no touch input.

8. The steering wheel of claim 1, wherein the controller is configured to deactivate an activated touch area for manipulation if no touch input is received in the activated touch area for manipulation.

9. The steering wheel of claim 1, wherein the base comprises a metal complex, and the sensor electrode is a conductive layer filling a groove in the base.

10. The steering wheel of claim 1, wherein the wheel frame comprises a rim, and the base is formed to cover the rim.

11. The steering wheel of claim 10, wherein the base is provided in the plural, and the plurality of bases are formed to cover different areas on the rim.

12. The steering wheel of claim 1, further comprising: a sensor integrated circuit (IC) electrically connected to the sensor electrode and configured to detect an amount of change in capacitance of the sensor electrode.

13. The steering wheel of claim 12, wherein:
the wheel frame comprises a spoke, and
the steering wheel further comprises a printed circuit board arranged on the spoke and having the sensor IC mounted thereon.

14. The steering wheel of claim 13, further comprising: a connector connecting the sensor electrode and the printed circuit board.

15. The steering wheel of claim 14, wherein the connector comprises a body part coupled with the base and a contact part in contact with the printed circuit board.

16. The steering wheel of claim 15, wherein the body part comprises a flexible printed circuit board.

17. The steering wheel of claim 1, wherein the sensor electrode comprises
a first sensor electrode, and
a second sensor electrode spaced apart from the first sensor electrode.

18. The steering wheel of claim 17, wherein the first sensor electrode and the second sensor electrode are arranged on a same layer.

19. A method for controlling a steering wheel having a wheel frame and a base coupled to cover the wheel frame, the method comprising:
receiving a touch input of a driver by a sensor electrode arranged on the base and configured to receive a touch input of the driver; and
setting up a touch area for manipulation to control components of a vehicle based on a touch area of the sensor electrode having received the touch input,
wherein the setting up a touch area for manipulation includes: setting up a plurality of touch areas for manipulation, activating the plurality of touch areas for manipulation, and if at least one of the plurality of touch areas for manipulation receives a touch input, deactivating the rest of the plurality of touch areas for manipulation, in which no touch input is received.

* * * * *